US010924115B2

(12) United States Patent
Huang (10) Patent No.: US 10,924,115 B2
(45) Date of Patent: Feb. 16, 2021

(54) LEVEL SHIFTER CAPABLE OF OUTPUTTING POSITIVE AND NEGATIVE VOLTAGES

(71) Applicant: Shenzhen Goodix Technology Co., Ltd., Guangdong (CN)

(72) Inventor: Muli Huang, Taipei (TW)

(73) Assignee: Shenzhen Goodix Technology Co., Ltd., Guangdong (CN)

( * ) Notice: Subject to any disclaimer, the term of this patent is extended or adjusted under 35 U.S.C. 154(b) by 11 days.

(21) Appl. No.: 16/197,255

(22) Filed: Nov. 20, 2018

(65) Prior Publication Data

US 2019/0089356 A1 Mar. 21, 2019

Related U.S. Application Data

(63) Continuation of application No. PCT/CN2017/097857, filed on Aug. 17, 2017.

(51) Int. Cl.
*H03K 19/00* (2006.01)
*H03K 19/0175* (2006.01)
*H03K 3/356* (2006.01)
*H03K 17/687* (2006.01)
*H04N 5/374* (2011.01)

(52) U.S. Cl.
CPC ........... *H03K 19/017509* (2013.01); *H03K 3/356086* (2013.01); *H03K 3/356113* (2013.01); *H03K 17/6872* (2013.01); *H04N 5/374* (2013.01)

(58) Field of Classification Search
CPC ....... H03K 3/356086; H03K 3/356113; H03K 17/6872; H03K 19/017509; H04N 5/374
See application file for complete search history.

(56) References Cited

U.S. PATENT DOCUMENTS

| | | | | |
|---|---|---|---|---|
| 5,834,948 A | * | 11/1998 | Yoshizaki | ...... H03K 19/018521 326/81 |
| 5,969,542 A | * | 10/1999 | Maley | .................... H03K 3/012 326/17 |
| 6,166,961 A | * | 12/2000 | Lee | ........................ G11C 5/145 365/185.18 |
| 8,643,425 B2 | * | 2/2014 | Chaudhry | ........ H03K 3/356182 327/333 |
| 9,024,674 B1 | | 5/2015 | Kim | |

(Continued)

FOREIGN PATENT DOCUMENTS

| CN | 1158028 A | 8/1997 |
|---|---|---|
| CN | 1221206 A | 6/1999 |

(Continued)

*Primary Examiner* — Kurtis R Bahr
(74) *Attorney, Agent, or Firm* — Winston Hsu (57) ABSTRACT

The present application provides a level shifter comprising a first P-type transistor; a second P-type transistor; a third P-type transistor, coupled to the second P-type transistor; a fourth P-type transistor, coupled to the first P-type transistor; a first N-type transistor, coupled to the third P-type transistor; a second N-type transistor, coupled to the fourth P-type transistor; a third N-type transistor, coupled to the first N-type transistor; a fourth N-type transistor, coupled to the second N-type transistor; and an inverter, coupled between the third N-type transistor and the fourth N-type transistor, wherein an input terminal of the inverter receives an input signal of the level shifter.

16 Claims, 4 Drawing Sheets

(56) References Cited

U.S. PATENT DOCUMENTS

| | | | | |
|---|---|---|---|---|
| 9,361,995 B1* | 6/2016 | Tran | ............... | G11C 5/145 |
| 9,859,894 B1* | 1/2018 | Chou | ............... | H03K 17/102 |
| 2006/0091907 A1* | 5/2006 | Khan | ............... | H03K 17/102 |
| | | | | 326/81 |
| 2012/0314505 A1* | 12/2012 | Nam | ............... | G11C 16/12 |
| | | | | 365/185.23 |

FOREIGN PATENT DOCUMENTS

| | | |
|---|---|---|
| CN | 1764069 A | 4/2006 |
| CN | 1783719 A | 6/2006 |
| CN | 102904565 A | 1/2013 |
| CN | 103973103 A | 8/2014 |
| JP | 2005-175752 A | 6/2005 |

* cited by examiner

LEVEL SHIFTER CAPABLE OF OUTPUTTING POSITIVE AND NEGATIVE VOLTAGES

CROSS REFERENCE TO RELATED APPLICATIONS

The present application is a continuation of international application No. PCT/CN2017/097857, filed on Aug. 17, 2017, of which is incorporated herein by reference in its entirety.

FIELD OF THE INVENTION

The present application relates to a level shifter, and more particularly, to a level shifter capable of outputting positive and negative voltages.

BACKGROUND

Image sensor has been widely applied in electronic devices with image capturing devices and digital cameras. In general, the image sensor comprises a pixel sensing array. A row or a column of the pixel sensing array may be coupled to a row of level shifters, to shift the output voltages.

Nevertheless, for circuitry with specific requirements, some circuit therein operates between a high voltage and a low voltage, where the low voltage is a negative voltage lower than a ground voltage, and an amplitude between the high voltage and the low voltage is larger than a breakdown voltage for general components within the circuitry. In the prior art, it may utilize an additional high voltage manufacturing process to manufacture the circuit components with high breakdown voltage to realize the level shifter required by the system, such that a production cost is enhanced.

Therefore, it is necessary to improve the prior art.

SUMMARY

It is therefore a primary objective of the present application to provide a level shifter capable of outputting positive and negative voltages and signals with large amplitude, to improve over disadvantages of the prior art.

To solve the technical problem stated in the above, an embodiment of the present application provides a level shifter, comprising a first P-type transistor; a second P-type transistor; a third P-type transistor, coupled to the second P-type transistor; a fourth P-type transistor, coupled to the first P-type transistor; a first N-type transistor, coupled to the third P-type transistor; a second N-type transistor, coupled to the fourth P-type transistor; a third N-type transistor, coupled to the first N-type transistor; a fourth N-type transistor, coupled to the second N-type transistor; and an inverter, coupled between the third N-type transistor and the fourth N-type transistor, wherein an input terminal of the inverter receives an input signal of the level shifter; wherein a source of the first P-type transistor is coupled to a source of the second P-type transistor and forms a first node, a gate of the third P-type transistor is coupled to a gate of the fourth P-type transistor and forms a second node, a gate of the first N-type transistor is coupled to a gate of the second N-type transistor and forms a third node, a source of the third N-type transistor is coupled to a source of the fourth N-type transistor and forms a fourth node.

For example, the first N-type transistor, the second N-type transistor, the third N-type transistor and the fourth N-type transistor are all N-type transistors with deep N-wells.

For example, the first node receives a first voltage, the second node receives a second voltage or a fifth voltage, the third node receives a third voltage, the fourth node receives a fourth voltage, and the fourth voltage is a negative voltage.

For example, a voltage difference between the fourth voltage and the first voltage is greater than a specific breakdown voltage of the level shifter.

For example, when the first voltage is greater than a first specific value, the gate of the third P-type transistor and the gate of the fourth P-type transistor receives the second voltage; when the first voltage (VPH) is smaller than a second specific value, the gate of the third P-type transistor and the gate of the fourth P-type transistor receives the fifth voltage; and the fifth voltage is smaller than the second voltage.

For example, the level shifter further comprises a first power supply unit, configured to provide the second voltage; a second power supply unit, configured to provide the fifth voltage; and a switching unit, comprising a terminal coupled to the second node, another terminal coupled to the first power supply unit, another terminal coupled to the second power supply unit; wherein when the first voltage is greater than a first specific value, the switching unit conducts a connection between the second node and the first power supply unit; wherein when the first voltage is smaller than a second specific value, the switching unit conduct a connection between the second node and the second power supply unit.

For example, the inverter outputs a first high voltage and a first low voltage, wherein the first high voltage is the third voltage, and the first low voltage is the fourth voltage.

For example, an output terminal of the level shifter is between the fourth P-type transistor and the second N-type transistor.

For example, the level shifter further comprises an output circuit, comprising a first P-type output transistor, coupled to the first P-type transistor; a second P-type output transistor, coupled to the first P-type output transistor and the second node; a first N-type output transistor, coupled to the second P-type output transistor and the third node; and a second N-type output transistor, coupled to the first N-type output transistor and the fourth N-type transistor.

For example, the level shifter further comprises a first power supply unit, configured to provide the second voltage; a second power supply unit, configured to provide the fifth voltage; and a switching unit, comprising a terminal coupled to the second node, another terminal coupled to the first power supply unit, another terminal coupled to the second power supply unit; wherein when the first voltage is greater than a first specific value, the switching unit conducts a connection between the second node and the first power supply unit; wherein when the first voltage is smaller than a second specific value, the switching unit conduct a connection between the second node and the second power supply unit.

For example, the inverter outputs a first high voltage and a first low voltage, wherein the first high voltage is the third voltage, and the first low voltage is the fourth voltage.

For example, an output terminal of the level shifter is between the fourth P-type transistor and the second N-type transistor.

For example, the level shifter further comprises an output circuit, comprising a first P-type output transistor, coupled to the first P-type transistor; a second P-type output transistor, coupled to the first P-type output transistor and the second node; a first N-type output transistor, coupled to the second P-type output transistor and the third node; and a second N-type output transistor, coupled to the first N-type output transistor and the fourth N-type transistor.

For example, the level shifter further comprises a first buffering circuit, comprising a first buffering inverter, comprising an input terminal coupled to the fourth P-type transistor, an output terminal coupled to the first P-type output transistor, a high DC (direct current) biasing terminal coupled to the first node, and a low DC biasing terminal coupled to the second node; a second buffering inverter, comprising an input terminal coupled to the fourth N-type transistor, an output terminal coupled to the second N-type output transistor, a high DC biasing terminal coupled to the third node, and a low DC biasing terminal coupled to the fourth node.

For example, the first buffering circuit further comprises a pull-down transistor, coupled between the input terminal of the first buffering inverter and the second node, controlled by a pull-down signal to be cutoff or conducted; and a pull-up transistor, coupled between the input terminal of the second buffering inverter and the third node, controlled by a pull-up signal to be cutoff or conducted.

For example, the pull-down signal is related to a first output signal of the first buffering inverter, the pull-up signal is related to a second output signal of the second buffering inverter.

For example, the first buffering circuit further comprises a plurality of first auxiliary inverters, coupled between the output terminal of the first buffering inverter and the first P-type output transistor; and a plurality of second auxiliary inverters, coupled between the output terminal of the second buffering inverter and the second N-type output transistor.

For example, the pull-down signal is related to a plurality of output signals of the first buffering inverter and the plurality of first auxiliary inverters, and the pull-up signal is related to a plurality of output signals of the second buffering inverter and the plurality of second auxiliary inverters.

For example, when an output signal of the first buffering inverter is a high voltage, the pull-down transistor is conducted; when an output signal of the second buffering inverter is a high voltage, the pull-up transistor is conducted.

For example, the level shifter further comprises a second buffering circuit, coupled to the first P-type transistor, the third P-type transistor, the first N-type transistor and the third N-type transistor; wherein the second buffering circuit and the first buffering circuit have the same circuit structure.

For example, an output terminal of the level shifter is between the second P-type output transistor and the first N-type output transistor.

For example, the level shifter further comprises a first capacitor, comprising a terminal coupled between the first P-type transistor and the third P-type transistor, the other terminal coupled to an output terminal of the inverter; and a second capacitor, comprising a terminal coupled between the second P-type transistor and the fourth P-type transistor, and the other terminal coupled to the input terminal of the inverter.

For example, the level shifter is applied in a row decoder of an image sensor.

The embodiments of the present application utilizes the cascode-connected transistors to apportion/share the voltage difference corresponding to the amplitude of the output signal; utilizes the N-type transistors with the deep N wells to output the output signal with the low voltage as the negative voltage; utilizes the output circuit to provide sufficient and steady output current to drive the back end/stage circuit; utilizes the buffering circuit to block affection toward the output circuit caused by instantaneous voltage variation; utilizes the pull-down/pull-up transistor to eliminate the leakage current of the buffering inverter; utilizes the capacitors coupled to the inverter to shorten the transition time interval. The embodiments of the present application may output the output signal with large amplitude, and does not need the high voltage manufacturing process to manufacture the components therein, which has advantages of reducing production cost.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

In the following specification and claims, the term "coupled" is used to refer to any direct or indirect electrically connecting means, and the term "electrically connected" refers to directly electrically connected.

Figure 1:
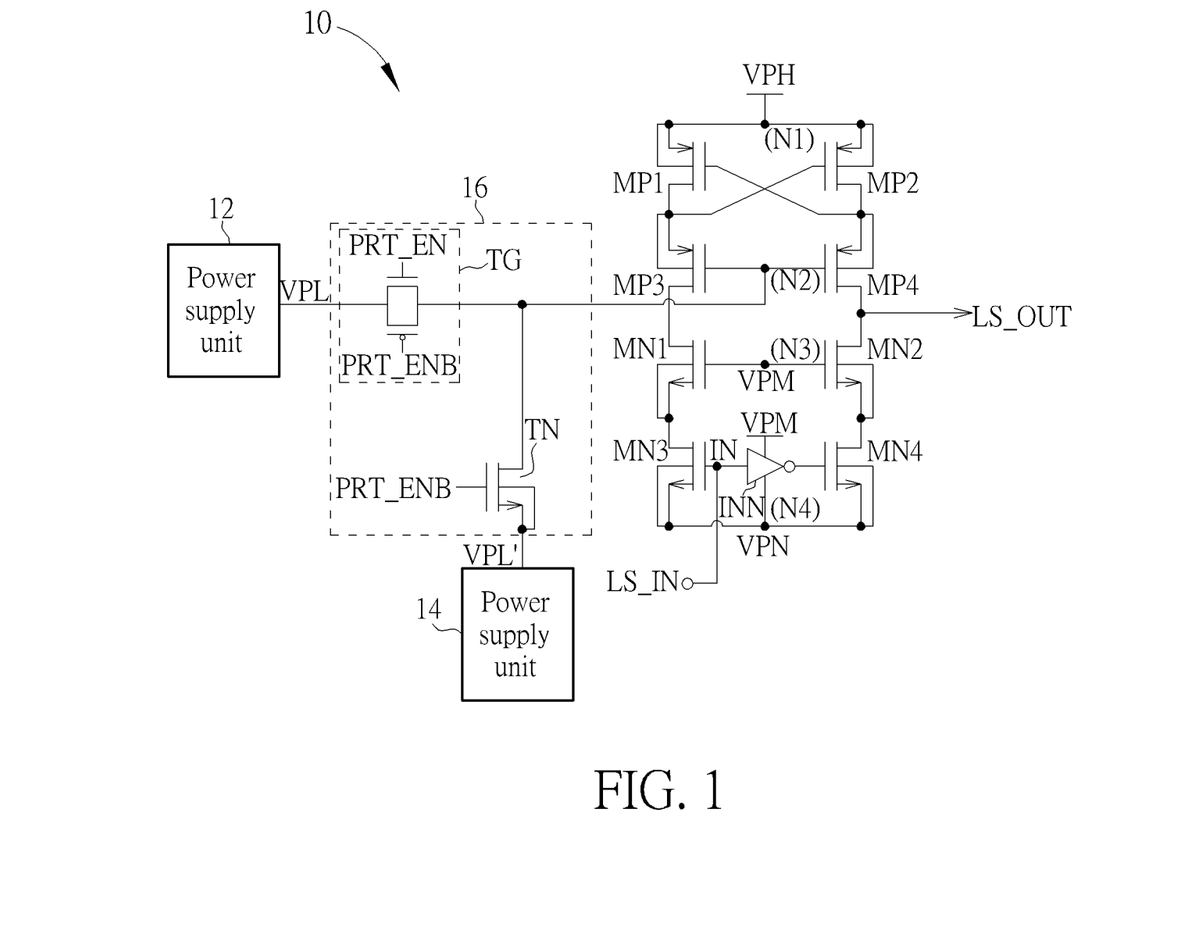
FIG. 1 is a schematic diagram of a level shifter according to an embodiment of the present application.

Please refer to FIG. 1. FIG. 1 is a schematic diagram of a level shifter 10 according to an embodiment of the present application. The level shifter 10 is a circuit manufactured by a specific manufacturing process, which has a specific breakdown voltage BV. In other words, if a cross voltage applied on a component within the level shifter 10 is greater than the specific breakdown voltage BV, the semiconductor components within the level shifter 10 would be broken-down, such that the level shifter 10 would be damaged. The level shifter 10 is configured to convert a signal with small amplitude into a signal with large amplitude, and an amplitude of the output signal of the level shifter 10 is greater than the specific breakdown voltage BV.

As shown in FIG. 1, the level shifter 10 comprises P-type transistors MP1, MP2, MP3, MP4, N-type transistors MN1, MN2, MN3, MN4 and an inverter INV. The P-type transistors MP1, MP2, MP3, MP4 and the N-type transistors MN1, MN2, MN3, MN4 are cascode-connected. Specifically, the sources of the P-type transistors MP3, MP4 are respectively coupled to the drains of the P-type transistors MP1, MP2, the drains of the N-type transistors MN1, MN2 are respectively coupled to the drains of the P-type transistors MP3, MP4, and the drains of the N-type transistors MN3, MN4 are respectively coupled to the sources of the N-type transistors MN1, MN2. Moreover, the sources of the P-type transistors MP1, MP2 (denoted as a node N1) receive a voltage VPH, the gates of the P-type transistors MP3, MP4 (denoted as a node N2) may receive a voltage VPL, the gates of the N-type transistors MN1, MN2 (denoted as a node N3) receive a voltage VPM, and the sources of the N-type transistors MN3, MN4 (denoted as a node N4) receive a voltage VPN.

An input terminal IN of the inverter INV is coupled to the gate of the N-type transistor MN3, and an output terminal OUT of the inverter INV is coupled to the gate of the N-type transistor MN4. The high DC (direct current) biasing terminal of the inverter INV receives the voltage VPM, i.e., the DC biasing voltage received by the source of the P-type transistor in the inverter INV is the voltage VPM. The low DC biasing terminal of the inverter INV receives the voltage VPN, i.e., the DC biasing voltage received by the source of the N-type transistor in the inverter INV is the voltage VPN. In other words, a high voltage outputted by the inverter INV is the voltage VPM, and a low voltage outputted by the inverter INV is the voltage VPN. In an embodiment, the voltage VPN is a negative voltage, e.g., the voltage VPN may be −1V. Hence, the N-type transistors MN1, MN2, MN3, MN4 and the N-type transistors in the inverter INV are the N-type transistors with deep N wells. Structures of the N-type transistors with the deep N wells are known by the art, which is not narrated herein for brevity.

Figure 4:
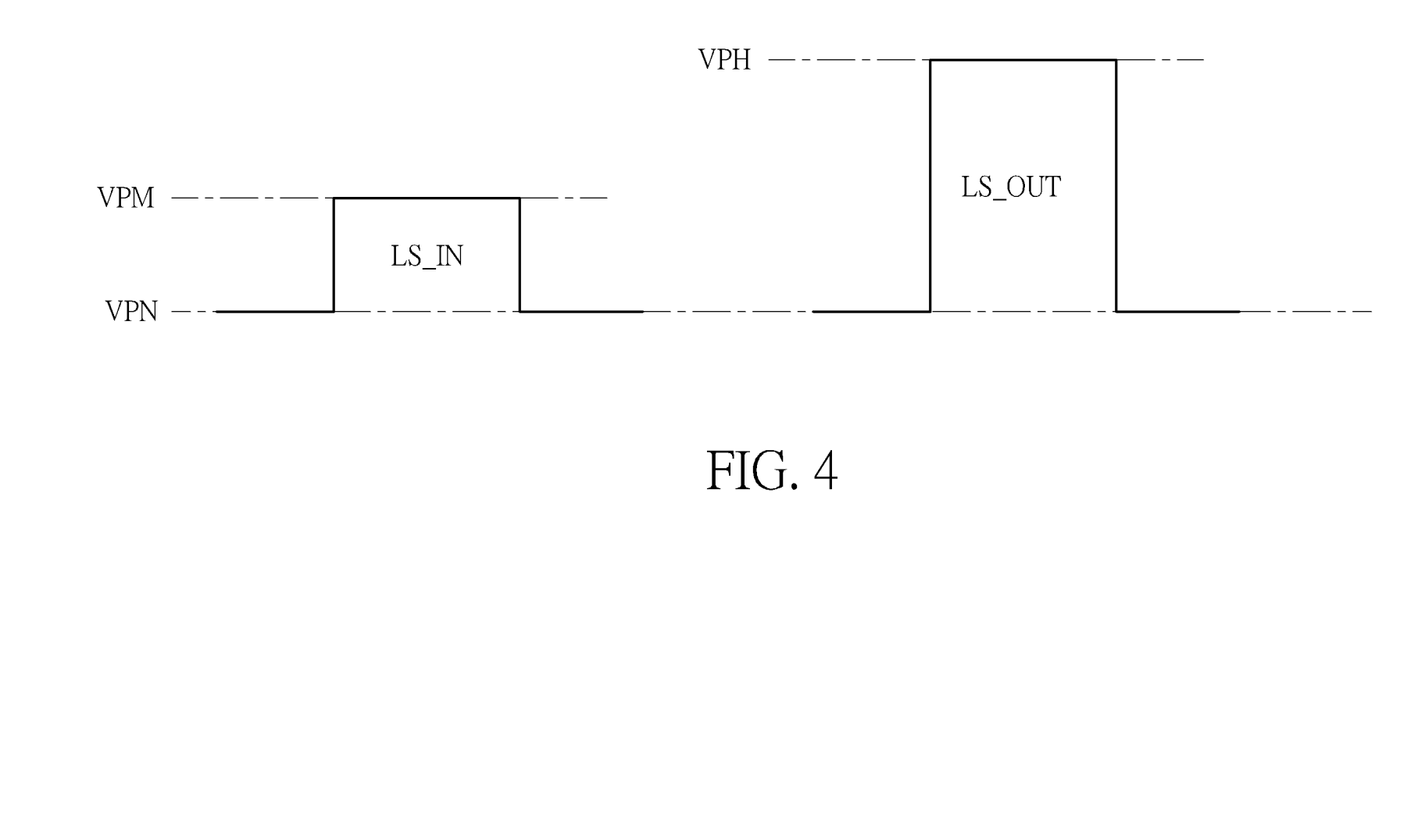
FIG. 4 is a schematic diagram of waveforms of a plurality of signals according to an embodiment of the present application.

In addition, the P-type transistors MP1, MP2, MP3, MP4 forms a positive feedback loop. Specifically, the source of the P-type transistor MP3 is coupled to the gate of the P-type transistor MP2, and the source of the P-type transistor MP4 is coupled to the gate of the P-type transistor MP1. The input terminal IN of the inverter INV receives an input signal LS_IN of the level shifter 10, and the drains of the P-type transistor MP4 and the N-type transistor MN2 output an output signal LS_OUT of the level shifter 10. The amplitude of the input signal LS_IN is between the voltage VPN and the voltage VPM, and the amplitude of the output signal LS_OUT is between the voltage VPN and the voltage VPH. The waveforms of the input signal LS_IN and the output signal LS_OUT may be referred to FIG. 4.

Operational principles of the level shifter 10 are described as follows. In an embodiment, the voltage VPN is −1V, the voltage VPM is 2.6V, the voltage VPL is 1V, the voltage VPH is 4.6V, and the breakdown voltage BV of the level shifter 10 is 3.6V. When the input signal LS_IN is low (i.e., the voltage VPN=−1V), and the output terminal OUT of the inverter INV is high (i.e., the voltage VPM=2.6V). At this time, the N-type transistors MN2, MN4 and the P-type transistors MP1, MP3 are conducted, and the N-type transistors MN1, MN3 and the P-type transistors MP2, MP4 are cutoff. the drain voltage of the N-type transistor MN2 is pulled down to the voltage VPN (i.e., −1V). Thus, the level shifter 10 outputs the output signal LS_OUT as the voltage VPN (i.e., −1V). On the other hand, when the input signal LS_IN is high (i.e., the voltage VPM=2.6V), the output terminal OUT of the inverter INV is low (i.e., the voltage VPN=−1V). At this time, the N-type transistors MN1, MN3 and the P-type transistors MP2, MP4 are conducted, and the N-type transistors MN2, MN4 and the P-type transistors MP1, MP3 are cutoff, the drain voltage of the P-type transistor MP1 is pulled up to the voltage VPH (i.e., 4.6V). Thus, the level shifter 10 outputs the output signal LS_OUT as the voltage VPH.

As can be seen from the above, when the level shifter 10 operates, the level shifter 10 utilizes the P-type transistors MP3, MP4 and the N-type transistors MN1, MN2 which are cascode-connected to apportion/share the voltage difference between the voltage VPN and the voltage VPH, such that the voltage (s) applied over the components within the level shifter 10, which may be $V_{GD}/V_{DG}$, $V_{GS}/V_{SG}$, $V_{DS}/V_{SD}$ or even $V_{BD}$, would not be greater than the breakdown voltage BV. Thus, when the output signal LS_OUT has the amplitude as 5.6V, the level shifter 10 is able to normally operate and would not be damaged.

In another perspective, when the level shifter is required to output a high amplitude signal in a circuitry, the technology in the prior art has to utilize a high voltage manufacturing process to manufacture circuit components within the level shifter, to prevent the circuit components breaks down. In comparison, the level shifter 10 of the present application may be consisted of the circuit components manufactured by the low voltage manufacturing process, and the components would not be break down, and the production cost would be reduced.

Furthermore, in some embodiments/applications, the voltage VPH may be lower than 4.6V. For example, the voltage VPH may be 3.1V. In this case, the level shifter 10 may lower the voltage at the node N2, such that the P-type transistors MP1, MP2, MP3, MP4 can be conducted when they should be conducted, to maintain normal operation of the level shifter 10. For example, the level shifter 10 may comprise a switching unit 16. The switching unit 16 may comprise three terminals. The three terminals of the switching unit 16 are respectively coupled to the node N2, a power supply unit 12 and a power supply unit 14. The power supply unit 12 may provide the voltage VPL, and the power supply unit 14 may provide the voltage VPL' less than the voltage VPL (i.e., VPL'<VPL). When the voltage VPH is greater than a first specific value, the switching unit 16 conducts a connection between the node N2 and the power supply unit 12, and the node N2 may receive the voltage VPL; when the voltage VPH is less than a second specific value, the switching unit 16 conducts a connection between the node N2 and the power supply unit 14, and the node N2 may receive the voltage VPL'. The first specific value and the second specific value may be adjusted according to practical situation, as long as the P-type transistors MP1, MP2, MP3, MP4 could be conducted normally when they should be conducted, the requirements of the present invention is satisfied. In an embodiment, the power supply unit 14 may be simply a ground terminal, i.e., the voltage VPL' is 0V. In an embodiment, the switching unit 16 may comprise a transmission gate TG and a transistor TN. When the voltage VPH is greater than the first specific value, the transmission gate TG is conducted and the transistor TN is cutoff; when the voltage VPH is less than the second specific value, the transmission gate TG is cutoff and the transistor TN is conducted.

Figure 2:
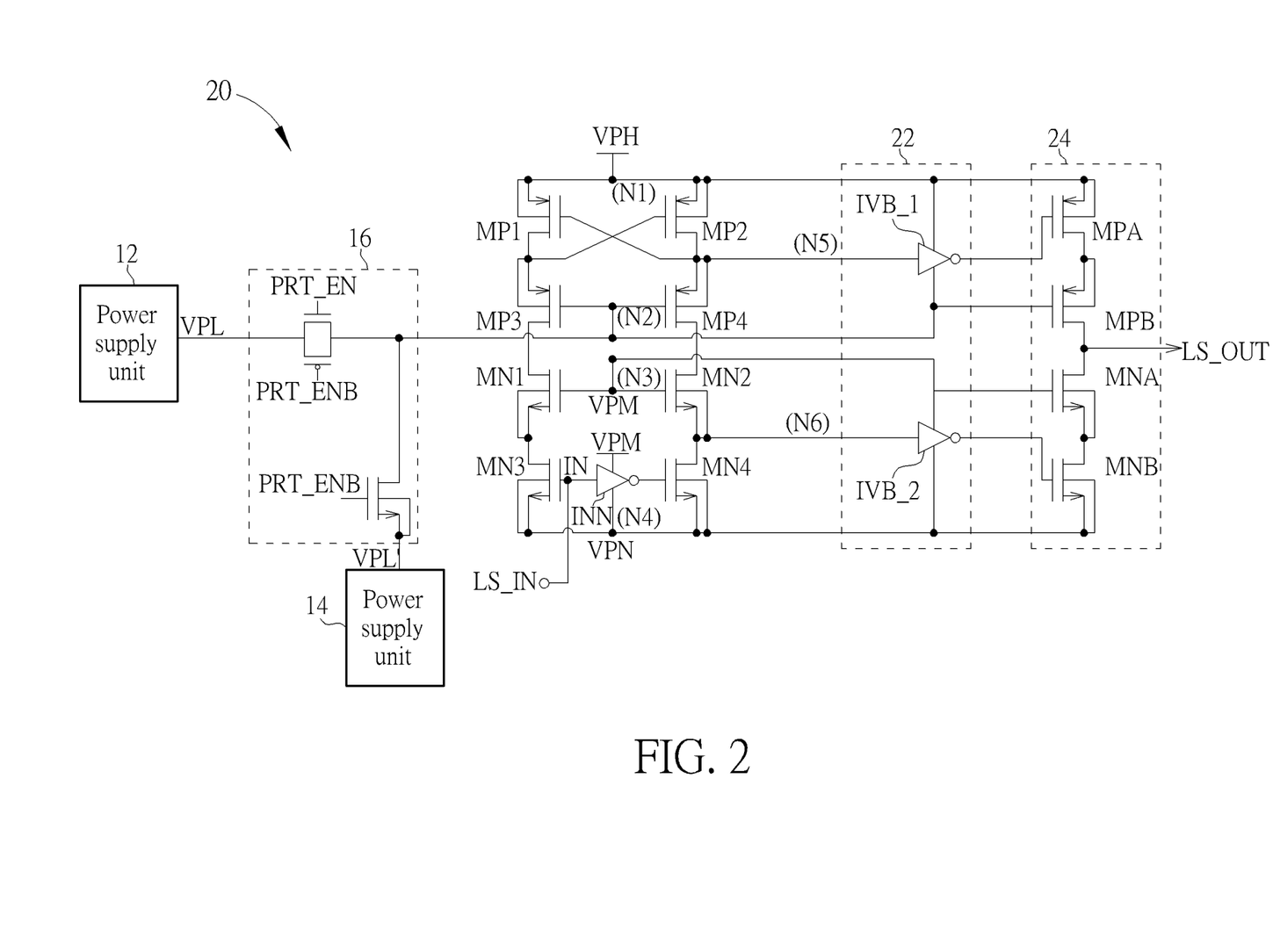
FIG. 2 is a schematic diagram of a level shifter according to an embodiment of the present application.

In addition, to enhance the driving capability of the level shifter toward the back end/stage circuit, the level shifter of the present application may comprise an output circuit and a buffering circuit. Specifically, please refer to FIG. 2. FIG. 2 is a schematic diagram of a level shifter 20 according to an embodiment of the present application. The level shifter 20 is similar to the level shifter 10, and thus, the same components are denoted by the same notations. Different from the level shifter 10, the level shifter 20 further comprises a buffering circuit 22 and an output circuit 24. The buffering circuit 22 is configured to block affection toward the output circuit 24 caused by instantaneous voltage variation, and the output circuit 24 is configured to provide sufficient and steady output current to drive the back end/stage circuit.

Specifically, the buffering circuit 22 comprises buffering inverters IVB_1, IVB_2. The high DC biasing terminal of the buffering inverter IVB_1 (i.e., the source of the P-type transistor in the buffering inverter IVB_1) is coupled to the node N1 receiving the voltage VPH, and the low DC biasing terminal of the buffering inverter IVB_1 (i.e., the source of the N-type transistor in the buffering inverter IVB_1) is coupled to the node N2 receiving the voltage VPL or VPL'. In other words, a high voltage outputted by the buffering inverter IVB_1 is the voltage VPH, and a low voltage outputted by the buffering inverter IVB_1 is the voltage VPL or VPL'. The high DC biasing terminal of the buffering inverter IVB_2 (i.e., the source of the P-type transistor in the buffering inverter IVB_2) is coupled to the node N3 receiving the voltage VPM, and the low DC biasing terminal of the buffering inverter IVB_2 (i.e., the source of the N-type transistor in the buffering inverter IVB_2) is coupled to the node N4 receiving the voltage VPN. In other words, a high voltage outputted by the buffering inverter IVB_2 is the voltage VPM, and a low voltage outputted by the buffering inverter IV_2 is the voltage VPN.

The output circuit 24 comprises P-type output transistors MPA, MPB and N-type output transistors MNA, MNB. The P-type output transistors MPA, MPB and the N-type output transistors MNA, MNB are cascode-connected. The connections therebetween are similar to which between the P-type transistors MP2, MP4 and the N-type transistors MN2, MN4. That is, the source of the P-type output transistor MPB is coupled to the drain of the P-type output transistor MPA, the drain of the N-type output transistor MNA is coupled to the drain of the P-type output transistor MPB, and the drain of the N-type output transistor MNB is coupled to the source of the N-type output transistor MNA. In addition, the gate of the P-type output transistor MPB is coupled to the node N2, the gate of the N-type output transistor MNA is coupled to the node N3, the source of the P-type output transistor MPA is coupled to the node N1, and the source of the N-type output transistor MNB is coupled to the node N4. In addition, the input terminal of the buffering inverter IVB_1 is coupled between the P-type transistors MP2 and MP4, the output terminal of the buffering inverter IVB_1 is coupled to the gate of the P-type output transistor MPA, the input terminal of the buffering inverter IVB_2 is coupled between the N-type transistors MN2 and MN4, the output terminal of the buffering inverter IVB_2 is coupled to the gate of the N-type output transistor MNB. In this case, the drains of the P-type output transistor MPB and the N-type output transistor MNA output the output signal LS_OUT of the level shifter 20. In addition, the N-type output transistors MNA, MNB and the N-type transistors in the buffering inverters IVB_1, IVB_2 are the N-type transistors with deep N wells.

Operational principles of the level shifter 20 are described as follows. When the voltage at the node N5 in FIG. 2 increases and approaches the voltage VPH, the buffering inverter IVB_1 would regard the voltage at the node N5 as high voltage, and the buffering inverter IVB_1 would output the low voltage as the voltage VPL or VPL', which accelerates the P-type output transistors MPA, MPB to be conducted and enhance the output current when the P-type output transistors MPA, MPB are conducted. Similarly, when the voltage at the node N6 in FIG. 2 decreases and approaches the voltage VPN, the buffering inverter IVB_2 would regard the voltage at the node N6 as the low voltage, and the buffering inverter IVB_2 would output the high voltage as the voltage VPM, which accelerates the N-type output transistors MNA, MNB to be conducted and enhance the output current when the N-type output transistors MNA, MNB are conducted.

Nevertheless, when the voltage at the node N5 in FIG. 2 decreases and approaches (but slightly greater than) the voltage VPL (or VPL'), the N-type transistor in the buffering inverter IVB_1 would have leakage current. Specifically, when the voltage at the node N5 in FIG. 2 approaches and slightly greater than the voltage VPL (or VPL'), the buffering inverter IVB_1 may regard the voltage at the node N5 is low, and the N-type transistor in the buffering inverter IVB_1 is supposed to be cutoff. But the voltage at the node N5 is greater than the voltage VPL (or VPL'), it causes that the N-type transistor in the buffering inverter IVB_1 is slightly conducted, which is supposed to be cutoff, and thereby causes the leakage current. Similarly, when the voltage at the node N6 in FIG. 2 increases and approaches (but slightly less than) the voltage VPM, the P-type transistor in the buffering inverter IVB_2 would also have leakage current.

To elinminate the leakage current of the buffering inverters IVB_1, IVB_2, a pull-down transistor may be inserted between the input terminal of the buffering inverter IVB_1 and the low DC biasing terminal (i.e., the source of the N-type transistor in the buffering inverter IVB_1), and a pull-up transistor may be inserted between the input terminal of the buffering inverter IVB_2 and the high DC biasing terminal (i.e., the source of the P-type transistor in the buffering inverter IVB_2).

Figure 3:
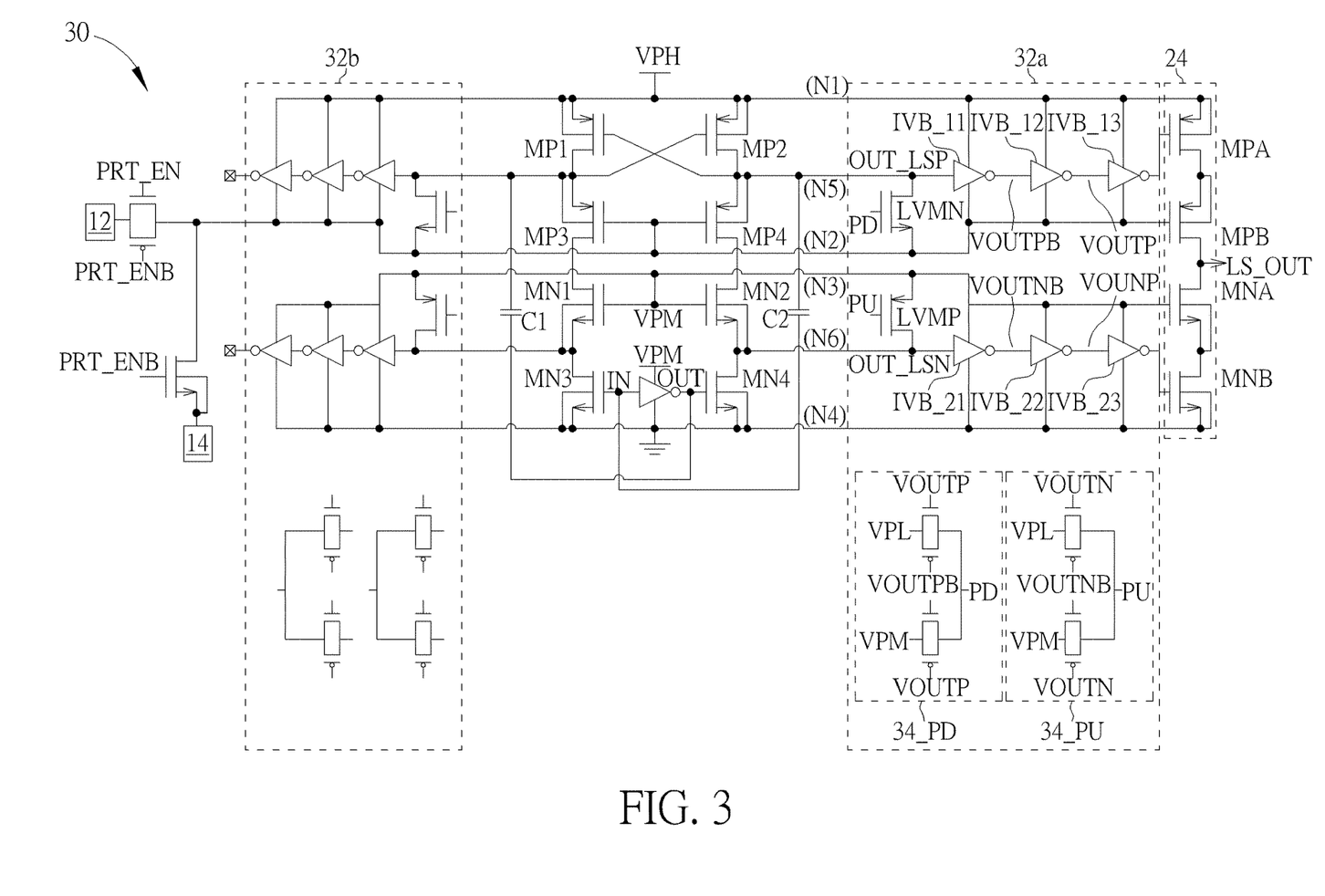
FIG. 3 is a schematic diagram of a level shifter according to an embodiment of the present application.

Specifically, Please refer to FIG. 3. FIG. 3 is a schematic diagram of a level shifter 30 according to an embodiment of the present application. The level shifter 30 is similar to the level shifter 20, and thus, the same components are denoted by the same notations. Different from the level shifter 20, the level shifter 30 comprises the buffering circuit 32_a, 32_b. The buffering circuit 32_b is coupled to the transistors MP1, MP3, MN1, MN3 and configured to form the same loading as which of the transistors MP2, MP4, MN2, MN4 on the other side when the voltage transition occurs. That is, no matter what the voltage transition is from the low to high or from high to low, the transistors MP1-MP4, MN1-MN4 in the level shifter 30 would bear the same/symmetric loading. In an embodiment, the buffering circuit 32_b and the buffering circuit 32_a may have the same circuit structure. The buffering circuit 32_b may be regarded as providing the same loading as which of the buffering circuit 32_a, and would not have physical operation on the signal/voltage generated by the transistors MP1, MP3, MN1, MN3. The following description would be mainly based on the buffering circuit 32_a.

The buffering circuit 32_a comprises a pull-down transistor LVMN, a pull-up transistor LVMP and inverters IVB_11-IVB_13, IVB_21-IVB_23, wherein the inverters IVB_11, IVB_21 may be regarded as the buffering inverters, and the inverters IVB_12, IVB_13, IVB_22, IVB_23 may be regarded as the auxiliary inverters. The high DC biasing terminal of the inverters IVB_11-IVB_13 are all coupled to the node N1, and the low DC biasing terminals of the inverters IVB_11-IVB_13 are all coupled to the node N2. The high DC biasing terminals of the inverters IVB_21-IVB_23 are all coupled to the node N3, and the low DC biasing terminals of the inverters IVB_21-IVB_23 are all coupled to the node N4. In other words, the high voltages outputted by the inverters IVB_21-IVB_23 are the voltage VPH, the low voltages outputted by the inverters IVB_11-IVB_13 are the voltage VPL or VPL', the high voltages outputted by the inverters IVB_21-IVB_23 are the voltage VPM, and the low voltages outputted by the inverters IVB_21-IVB_23 are the voltage VPN. In addition, the pull-down transistor LVMN and the N-type transistors within the inverters IVB_11-IVB_13, IVB_21-IVB_23 are the N-type transistors with deep N wells.

The pull-down transistor LVMN is controlled by a pull-down signal PD and coupled between the input terminal of the buffering inverter IVB_11 and the low DC biasing terminal. The pull-up transistor LVMP is controlled by a pull-up signal PU and coupled between the input terminal of the buffering inverter IVB_21 and the high DC biasing terminal. When the buffering inverter IVB_11 outputs the high voltage, the pull-down transistor LVMN is conducted, which can pull the voltage at the node N5 down to the voltage VPL (or VPL'). When the buffering inverter IVB_21 outputs the low voltage, the pull-up transistor LVMP is conducted, which can pull the voltage at the node N6 up to the voltage VPM.

Specifically, the buffering circuit 32_a may comprise a pull-down signal generator 34_PD and a pull-up signal generator 34_PU. The pull-down signal generator 34_PD and the pull-up signal generator 34_PU may comprises (a plurality of) transmission gates. When the output signal VOUTPB of the buffering inverter IVB_11 is high, the pull-down signal PD may be the voltage VPM and the pull-down transistor LVMN is conducted, which can pull the voltage at the node N5 down to the voltage VPL (or VPL'). When the output signal VOUTPB of the buffering inverter IVB_11 is low, the pull-down signal PD may be the voltage VPL and the pull-down transistor LVMN is cutoff. When the output signal VOUTNB of the buffering inverter IVB_21 is low, the pull-up signal PU may be the voltage VPL and the pull-up transistor LVMP is conducted, which can pull the voltage at the node N6 up to the voltage VPM. When the output signal VOUTNB of the buffering inverter IVB_21 is high, the pull-down signal PD may be the voltage VPM and the pull-up transistor LVMP is cutoff. In addition, the pull-down signal generator 34_PD and the pull-up signal generator 34_PU may further receive the output signal VOUTP of the inverter IVB_12 and the output signal VOUTN of the inverter IVB_22, which control the conduction status of the transmission gate. In short, the pull-down transistor LVMN and the pull-up transistor LVMP may be configured to eliminate the leakage current of the buffering inverter.

In addition, the level shifter 30 further comprises a capacitor C1 and a capacitor C2. A terminal of the capacitor C1 is coupled between the P-type transistors MP1, MP3, and the other terminal of the capacitor C1 is coupled to the output terminal OUT of the inverter INV. A terminal of the capacitor C2 is coupled between the P-type transistors MP2, MP4, and the other terminal of the capacitor C2 is coupled to the input terminal IN of the inverter INV. The capacitor C1 and the capacitor C2 are configured to enhance the transition capability of the level shifter 30 when the voltage transition (either from the low voltage to the high voltage or from the high voltage to the low voltage) occurs, and to shorten the time interval for voltage transition of the level shifter 30, which is to improve the system performance of the overall circuit.

In addition, the level shifter of the present application is not limited to be applied to a specific circuitry. For example, the level shifter of the present application may be applied within a row decoder within an image sensor, and not limited therein.

In summary, the embodiments of the present application utilizes the cascode-connected transistors to apportion/share the voltage difference corresponding to the amplitude of the output signal; utilizes the N-type transistors with the deep N wells to output the output signal with the low voltage as the negative voltage; utilizes the output circuit to provide sufficient and steady output current to drive the back end/stage circuit; utilizes the buffering circuit to block affection toward the output circuit caused by instantaneous voltage variation; utilizes the pull-down/pull-up transistor to eliminate the leakage current of the buffering inverter; utilizes the capacitors coupled to the inverter to shorten the time interval for voltage transition. The embodiments of the present application may output the output signal with large amplitude, and does not need the high voltage manufacturing process to manufacture the components therein, which has advantages of reducing production cost.

The foregoing is only embodiments of the present application, which is not intended to limit the present application. Any modification following the spirit and principle of the present application, equivalent substitutions, improvements should be included within the scope of the present application.

What is claimed is:

1. A level shifter, characterized by, comprising:
a first P-type transistor;
a second P-type transistor;
a third P-type transistor, coupled to the second P-type transistor;
a fourth P-type transistor, coupled to the first P-type transistor;
a first N-type transistor, coupled to the third P-type transistor;
a second N-type transistor, coupled to the fourth P-type transistor;
a third N-type transistor, coupled to the first N-type transistor;
a fourth N-type transistor, coupled to the second N-type transistor;
an inverter, coupled between the third N-type transistor and the fourth N-type transistor, wherein an input terminal of the inverter receives an input signal of the level shifter; and
an output circuit, comprising:
a first P-type output transistor, coupled to the first P-type transistor;
a second P-type output transistor, coupled to the first P-type output transistor and a second node;
a first N-type output transistor, coupled to the second P-type output transistor and a third node; and
a second N-type output transistor, coupled to the first N-type output transistor and the fourth N-type transistor, wherein a gate of the second N-type output transistor is coupled to the second N-type transistor and the fourth N-type transistor;
a first power supply unit, configured to provide a second voltage;
a second power supply unit, configured to provide a fifth voltage; and
a switching unit, comprising a terminal coupled to the second node, another terminal coupled to the first power supply unit, another terminal coupled to the second power supply unit;
wherein a source of the first P-type transistor is coupled to a source of the second P-type transistor and forms a first node, a gate of the third P-type transistor is coupled to a gate of the fourth P-type transistor and forms the second node, a gate of the first N-type transistor is coupled to a gate of the second N-type transistor and forms the third node, a source of the third N-type transistor is coupled to a source of the fourth N-type transistor and forms a fourth node;
wherein the first node receives a first voltage, the second node receives the second voltage or the fifth voltage, the third node receives a third voltage, the fourth node receives a fourth voltage, and the fourth voltage is a negative voltage;

wherein when the first voltage is greater than a first specific value, the switching unit conducts a connection between the second node and the first power supply unit;

wherein when the first voltage is smaller than a second specific value, the switching unit conducts a connection between the second node and the second power supply unit.

2. The level shifter of claim 1, characterized in that, the first N-type transistor, the second N-type transistor, the third N-type transistor and the fourth N-type transistor are all N-type transistors with deep N-wells.

3. The level shifter of claim 1, characterized in that, a voltage difference between the fourth voltage and the first voltage is greater than a specific breakdown voltage of the level shifter.

4. The level shifter of claim 3, characterized in that, the inverter outputs a first high voltage and a first low voltage, wherein the first high voltage is the third voltage, and the first low voltage is the fourth voltage.

5. The level shifter of claim 1, characterized in that, when the first voltage is greater than a first specific value, the gate of the third P-type transistor and the gate of the fourth P-type transistor receives the second voltage; when the first voltage is smaller than a second specific value, the gate of the third P-type transistor and the gate of the fourth P-type transistor receives the fifth voltage; and the fifth voltage is smaller than the second voltage.

6. The level shifter of claim 1, characterized in that, an output terminal of the level shifter is between the fourth P-type transistor and the second N-type transistor.

7. The level shifter of claim 1, characterized by, further comprising:
   a first buffering circuit, comprising:
      a first buffering inverter, comprising an input terminal coupled to the fourth P-type transistor, an output terminal coupled to the first P-type output transistor, a high DC (direct current) biasing terminal coupled to the first node, and a low DC biasing terminal coupled to the second node; and
      a second buffering inverter, comprising an input terminal coupled to the fourth N-type transistor, an output terminal coupled to the second N-type output transistor, a high DC biasing terminal coupled to the third node, and a low DC biasing terminal coupled to the fourth node.

8. The level shifter of claim 7, characterized in that, the first buffering circuit further comprises:

a pull-down transistor, coupled between the input terminal of the first buffering inverter and the second node, controlled by a pull-down signal to be cutoff or conducted; and a pull-up transistor, coupled between the input terminal of the second buffering inverter and the third node, controlled by a pull-up signal to be cutoff or conducted.

9. The level shifter of claim 8, characterized in that, the pull-down signal is related to a first output signal of the first buffering inverter, and the pull-up signal is related to a second output signal of the second buffering inverter.

10. The level shifter of claim 8, characterized in that, the first buffering circuit further comprises:
   a plurality of first auxiliary inverters, coupled between the output terminal of the first buffering inverter and the first P-type output transistor; and
   a plurality of second auxiliary inverters, coupled between the output terminal of the second buffering inverter and the second N-type output transistor.

11. The level shifter of claim 10, characterized in that, the pull-down signal is related to a plurality of output signals of the first buffering inverter and the plurality of first auxiliary inverters, and the pull-up signal is related to a plurality of output signals of the second buffering inverter and the plurality of second auxiliary inverters.

12. The level shifter of claim 8, characterized in that, when an output signal of the first buffering inverter is a high voltage, the pull-down transistor is conducted; when an output signal of the second buffering inverter is a high voltage, the pull-up transistor is conducted.

13. The level shifter of claim 7, characterized by, further comprising:
   a second buffering circuit, coupled to the first P-type transistor, the third P-type transistor, the first N-type transistor and the third N-type transistor;
   wherein the second buffering circuit and the first buffering circuit have the same circuit structure.

14. The level shifter of claim 1, characterized in that, an output terminal of the level shifter is between the second P-type output transistor and the first N-type output transistor.

15. The level shifter of claim 1, characterized by, further comprising:
   a first capacitor, comprising a terminal coupled between the first P-type transistor and the third P-type transistor, and the other terminal coupled to an output terminal of the inverter; and
   a second capacitor, comprising a terminal coupled between the second P-type transistor and the fourth P-type transistor, and the other terminal coupled to the input terminal of the inverter.

16. The level shifter of claim 1, characterized by, applied in a row decoder of an image sensor.

* * * * *